United States Patent
Tanaka et al.

(10) Patent No.: US 8,284,605 B2
(45) Date of Patent: Oct. 9, 2012

(54) SEMICONDUCTOR STORAGE DEVICE AND READING METHOD THEREOF

(75) Inventors: Rieko Tanaka, Yokohama (JP); Makoto Iwai, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 12/978,878

(22) Filed: Dec. 27, 2010

(65) Prior Publication Data
US 2011/0176366 A1    Jul. 21, 2011

(30) Foreign Application Priority Data
Jan. 15, 2010 (JP) .................................. 2010-007121

(51) Int. Cl.
*G11C 11/34* (2006.01)
(52) U.S. Cl. .............. 365/185.17; 365/196; 365/185.21; 365/102
(58) Field of Classification Search ............. 365/185.17, 365/196, 185.4, 102
See application file for complete search history.

(56) References Cited

U.S. PATENT DOCUMENTS
2003/0193824 A1* 10/2003 Tsukikawa et al. ........... 365/149
2010/0061149 A1    3/2010 Hosono et al.

FOREIGN PATENT DOCUMENTS
JP    2001-325796    11/2001

* cited by examiner

*Primary Examiner* — Jason Lappas
(74) *Attorney, Agent, or Firm* — Oblon, Spivak, McClelland, Maier & Neustadt, L.L.P.

(57) ABSTRACT

An embodiment of the invention provides a semiconductor storage device including a NAND string, a SEN node, and a capacitor. The NAND string includes plural series-connected memory cells, and one end of the NAND string is connected to a bit line while the other end is connected to a common source line. The SEN node is configured to be able to be electrically connected to a voltage source and the bit line. In the capacitor, one end is connected to the SEN node while the other end is connected to a CLK node to which a voltage within a predetermined range is applied. A discharge rate of the SEN node is enhanced by decreasing a capacitance during discharge of the SEN node only when a selected memory cell selected from the plural memory cells is an on-cell.

20 Claims, 8 Drawing Sheets

SEMICONDUCTOR STORAGE DEVICE AND READING METHOD THEREOF

CROSS-REFERENCE TO RELATED APPLICATIONS

This application is based upon and claims the benefit of priority from the prior Japanese Patent Application No. 2010-7121, filed on Jan. 15, 2010, the entire contents of which are incorporated herein by reference.

FIELD

Embodiments described herein relate generally to a semiconductor storage device and a reading method thereof.

BACKGROUND

Recently, a design rule of a memory cell has become finer and finer with increasing capacity of a NAND type flash memory. In the generation from a next 2X-nm generation (for example, 24-nm generation), there is a possibility of degrading a characteristic of the memory cell in association with the finer design rule. In reading data, a cell current passed through the memory cell is decreased while a leak current is increased. Therefore, a ratio (hereinafter referred to as an on/off ratio) of a cell current in the case where a read target memory cell (hereinafter referred to as a selected memory cell) is an on-cell and a cell current in the case where the selected memory cell is an off-cell is decreased. The decrease of the on/off ratio reduces a sense margin to increase a possibility of generating a read error. As used herein, the on-cell means a memory cell in a state in which electrons are not accumulated in a floating gate, and the off-cell means a memory cell in a state in which the electrons are accumulated in the floating gate. The on-cell is also referred to as a "1" cell, and the off-cell is also referred to as a "0" cell.

Additionally, with the finer design rule of the memory cell, a power-supply voltage of a sense amplifier tends to be decreased for the purpose of lower power consumption, which also contributes to the reduction of the sense margin.

Conventionally, for example, Japanese Patent Application Laid-Open No. 2001-325796 discloses a semiconductor storage device that includes a capacitor connected to a sense node as a measure against the decrease of the power-supply voltage of the sense amplifier. In the semiconductor storage device disclosed in Japanese Patent Application Laid-Open No. 2001-325796, one end of a capacitor 48c is connected to a sense node N4, and a potential at the other end (BOOST2) of the capacitor 48c is stepped up and stepped down, whereby a potential at the sense node N4 is stepped up and stepped down by capacitance coupling (see paragraphs [0175]-[0192]). However, the potential at the sense node fluctuates not only when the selected memory cell is the on-cell but also when the selected memory cell is the off-cell. Therefore, for the small on/off ratio, the off-cell lacks the sense margin, which possibly results in a problem in that the off-cell is mistakenly read as the on-cell.

DETAILED DESCRIPTION

An embodiment of the invention provides a semiconductor storage device including: a NAND string that includes plural series-connected memory cells, one end of the NAND string being connected to a bit line while the other end is connected to a common source line; a SEN node that is configured to be able to be electrically connected to a voltage source and the bit line; and a capacitor in which one end is connected to the SEN node while the other end is connected to a CLK node, a voltage within a predetermined range being applied to the CLK node, a discharge rate of the SEN node being enhanced by decreasing a capacitance during discharge of the SEN node only when a selected memory cell selected from the plural memory cells is an on-cell.

The semiconductor storage device of the embodiment will be described below with reference to the drawings. Incidentally, a component having an equivalent function is designated by the same numeral, and the detailed description will not be described. Numerical values used in the embodiment is described only by way of example, the embodiment of the invention is not limited to the numerical values.

Figure 1:
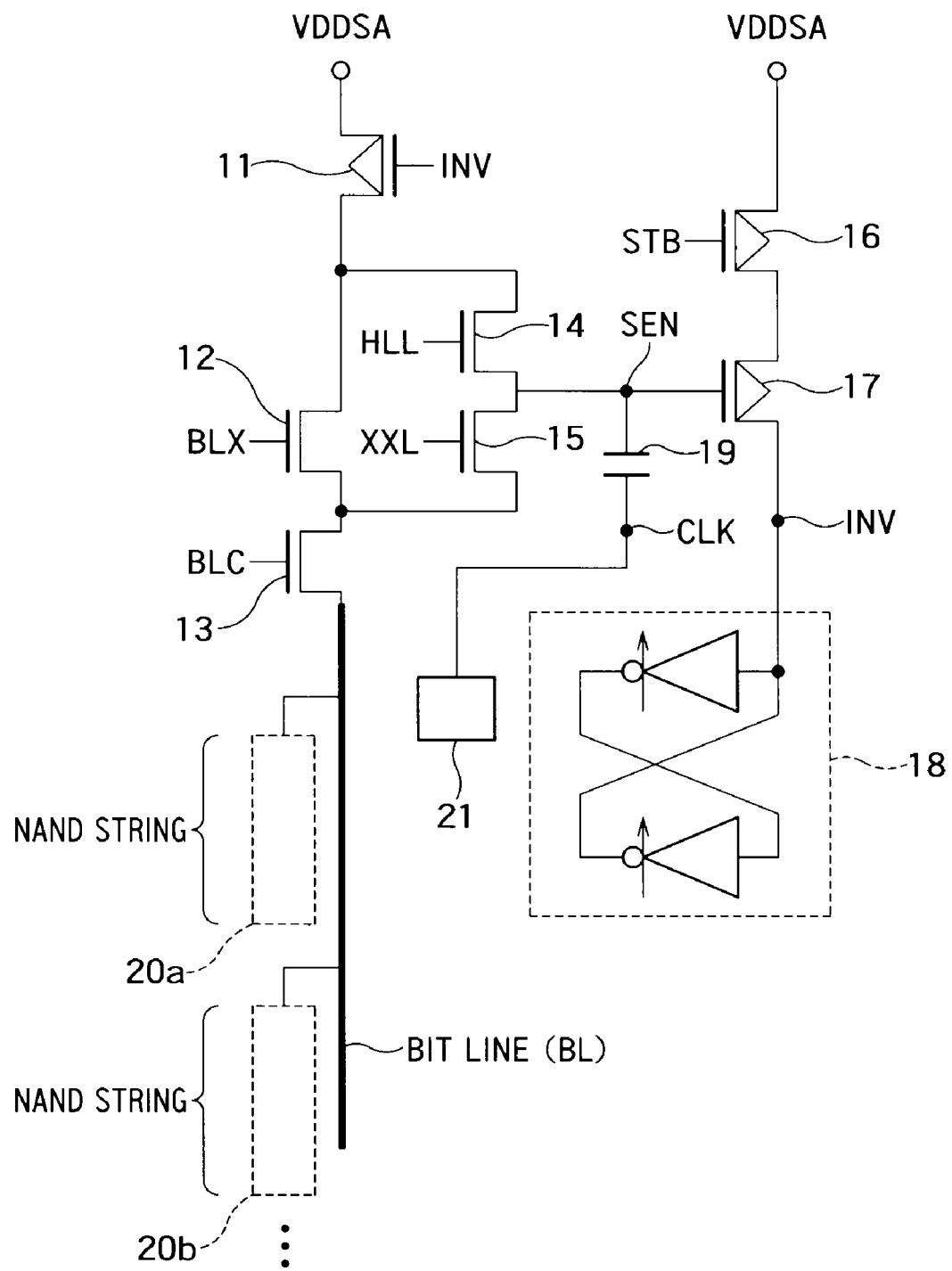
FIG. 1 is a view illustrating a schematic configuration of a NAND type flash memory according to an embodiment of the invention.

FIG. 1 illustrates a schematic configuration of a NAND type flash memory according to an embodiment of the invention. Each of NAND strings 20a, 20b, . . . is configured as plural memory cells being connected in series so as to share a source/drain diffusion layer. One end of a NAND string is connected to a bit line BL, and the other end of the NAND string is connected to a common source line (not illustrated).

As illustrated in FIG. 1, one end of the SEN node (sense node) is connected to a gate terminal of a PMOS transistor 17, and the other end can electrically be connected to a bit line BL through NMOS transistors 13 and 15. As described later, a potential Vsen at the SEN node is used to sense a state (on-cell/off-cell) of a memory cell.

A gate terminal INV of a PMOS transistor 11 is electrically connected to an INV node that is an input terminal of a latch circuit 18 illustrated in FIG. 1.

A read method of the conventional NAND type flash memory will be described before a read operation of the embodiment is described.

(1) First, the PMOS transistor 11 and the NMOS transistors 12, 13, 14, and 15 are turned on to electrically connect both the bit line BL and the SEN node to a power supply (voltage VDDSA) of a sense amplifier, thereby charging the bit line BL and the SEN node. It is to be noted that the INV node is previously discharged by a discharge circuit (not illustrated) to put the potential at the INV node in "Low", thereby turning on the PMOS transistor 11.

(2) The read target memory cell (selected memory cell) is selected. Specifically, sufficiently large gate voltages are applied to memory cells except the selected memory cell such that the memory cells are turned on irrespective of the state. On the other hand, a predetermined voltage is applied to the selected memory cell such that the selected memory cell is turned off when electrons exist in a floating gate and such that the selected memory cell is turned on when electrons do not exist in the floating gate.

(3) A gate terminal HLL of the NMOS transistor 14 is set to "Low" to turn off the NMOS transistor 14, thereby electrically separating the SEN node from a power supply of a sense amplifier. Therefore, a cell current (Icell) is passed to discharge the SEN node. The cell current is passed from the SEN node through the bit line BL to a common source line connected to one end of the NAND string. When the selected memory cell is the on-cell, the potential at the SEN node is largely decreased because of the passage of the large cell current. Then, the potential at the SEN node is decreased to a value (for example, 0.7 V) that is clamped by the NMOS transistor 12 (BLX) and the NMOS transistor 15 (XXL), unless the NMOS transistor 15 is turned off during the discharge. On the other hand, when the selected memory cell is the off-cell, ideally the potential at the SEN node is not decreased because the cell current is not passed. However, actually the potential at the SEN node is gently decreased because of a leak current.

(4) A gate terminal XXL of the NMOS transistor 15 is changed from "High" to "Low" when a predetermined time (for example, 1 µs) elapses since the discharge of the SEN node is started. Therefore, the SEN node is electrically separated from the bit line BL to stop the discharge of the SEN node.

(5) A determination of the state of the selected memory cell is made based on the potential at the SEN node after the discharge is stopped. Specifically, a gate terminal STB of a PMOS transistor 16 is set to "Low" to turn on the PMOS transistor 16. At this point, when the potential at the SEN node is sufficiently decreased, the PMOS transistor 17 is turned on to connect the INV node to the power supply of the sense amplifier, and the potential at the INV node is changed from "Low" to "High". More specifically, when the potential at the SEN node is VDDSA−|Vtp| or less, because the PMOS transistor 17 is turned on, the INV node is changed from "Low" to "High", where Vtp is a threshold voltage of the PMOS transistor 17. Hereinafter, the potential VDDSA−|Vtp| is referred to as a determination threshold.

On the other hand, when the potential at the SEN node is larger than the determination threshold VDDSA−|Vtp|, because the PMOS transistor 17 is turned off, the potential at the INV node is maintained in "Low".

As described above, in the NAND type flash memory, the determination whether the selected memory cell is the on-cell or the off-cell is made by the potential at the SEN node after the discharge is stopped, and the determination result is stored in latch circuit 18.

Next, an operation of the semiconductor storage device of the embodiment will be described below.

Figure 2:
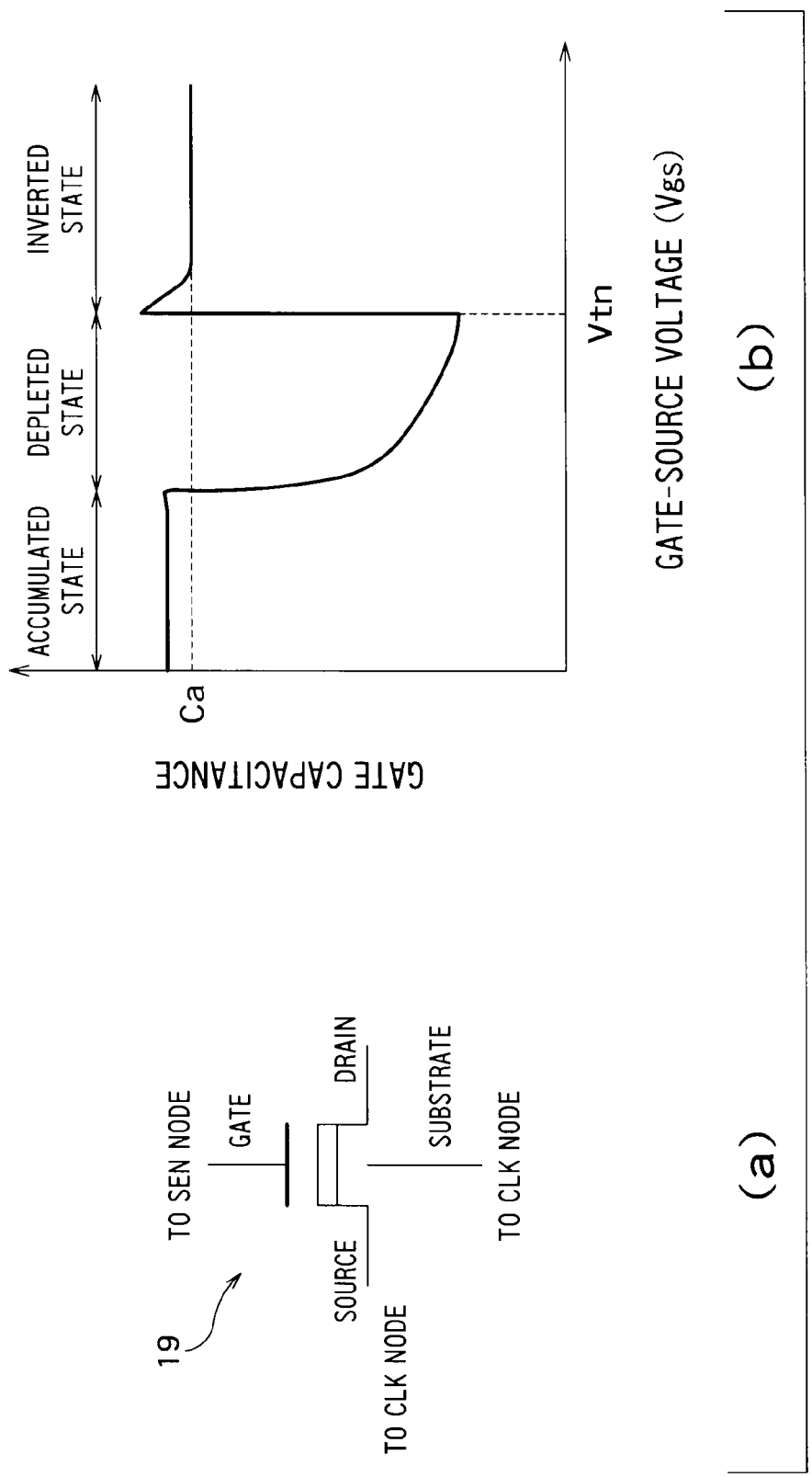
FIG. 2(a) is a view illustrating a configuration of a NMOS capacitor.
FIG. 2(b) is a view illustrating a C-V characteristic of the NMOS capacitor.

As can be seen from FIG. 1, the semiconductor storage device of the embodiment includes a NMOS capacitor 19. One end of the NMOS capacitor 19 is connected to an output terminal of a constant voltage source 21 called a CLK node, and the other end is connected to the SEN node. A configuration and a connection relationship of the NMOS capacitor 19 will be described in detail with reference to FIG. 2. FIG. 2(a) illustrates a configuration of the NMOS capacitor 19. As illustrated in FIG. 2, the NMOS capacitor 19 is a NMOS-structure capacitor that is formed by a NMOS transistor having a threshold voltage Vtn. As illustrated in FIG. 2(a), a gate is connected to the SEN node, and a substrate and a source are connected to the CLK node. Therefore, a potential Vg at the gate is equal to the potential Vsen at the SEN node, a potential Vb at the substrate and a potential Vs at the source are equal to a potential Vclk at the CLK node. That is, Vg=Vsen and Vb=Vs=Vclk.

FIG. 2(b) illustrates a C-V characteristic (dependence of a gate capacitance on a gate-source voltage Vgs) of the NMOS capacitor 19. As can be seen from FIG. 2(b), when the voltage Vgs is larger than the threshold voltage Vtn, that is, when the NMOS capacitor 19 is in the inverted state, a gate capacitance becomes a constant capacitance value (Ca). When the voltage Vgs is decreased to become smaller than the threshold voltage Vtn, the NMOS capacitor 19 enters a depletion region, and therefore the gate capacitance is rapidly decreased.

By use of the expression Vgs=Vsen−Vclk, a condition that the capacitance of the MOS capacitor 19 is rapidly decreased (i.e., Vgs<Vtn) can be expressed by Vsen<Vclk+Vtn. That is, when the potential at the SEN node becomes Vsen<Vclk+Vtn, the capacitance value of the NMOS capacitor 19 is rapidly decreased. Hereinafter, a potential (Vclk+Vtn) at the SEN node in which the capacitance of the NMOS capacitor 19 is rapidly changed is referred to as a capacitance sudden change potential.

In the embodiment, even if the on/off ratio is degraded in association with the finer design rule of the memory cell, the C-V characteristic of the NMOS capacitor 19 is utilized to secure a large sense margin, which allows the reduction of the read error.

Next, the operation of the semiconductor storage device of the embodiment will further be described in detail using numerical values.

The case where the voltage Vclk applied to the CLK node is 2.5 [V] will be described by way of example. Here, for the sake of convenience, the threshold voltage Vtn of the NMOS transistor is set to −0.7 [V] (i.e., depletion type), the power-supply voltage VDDSA of the sense amplifier is set to 2.5 [V], and the threshold voltage Vtp of the PMOS transistor (PMOS transistor 17) in which the SEN node is used as the gate is set to −1 [V].

Figure 3:
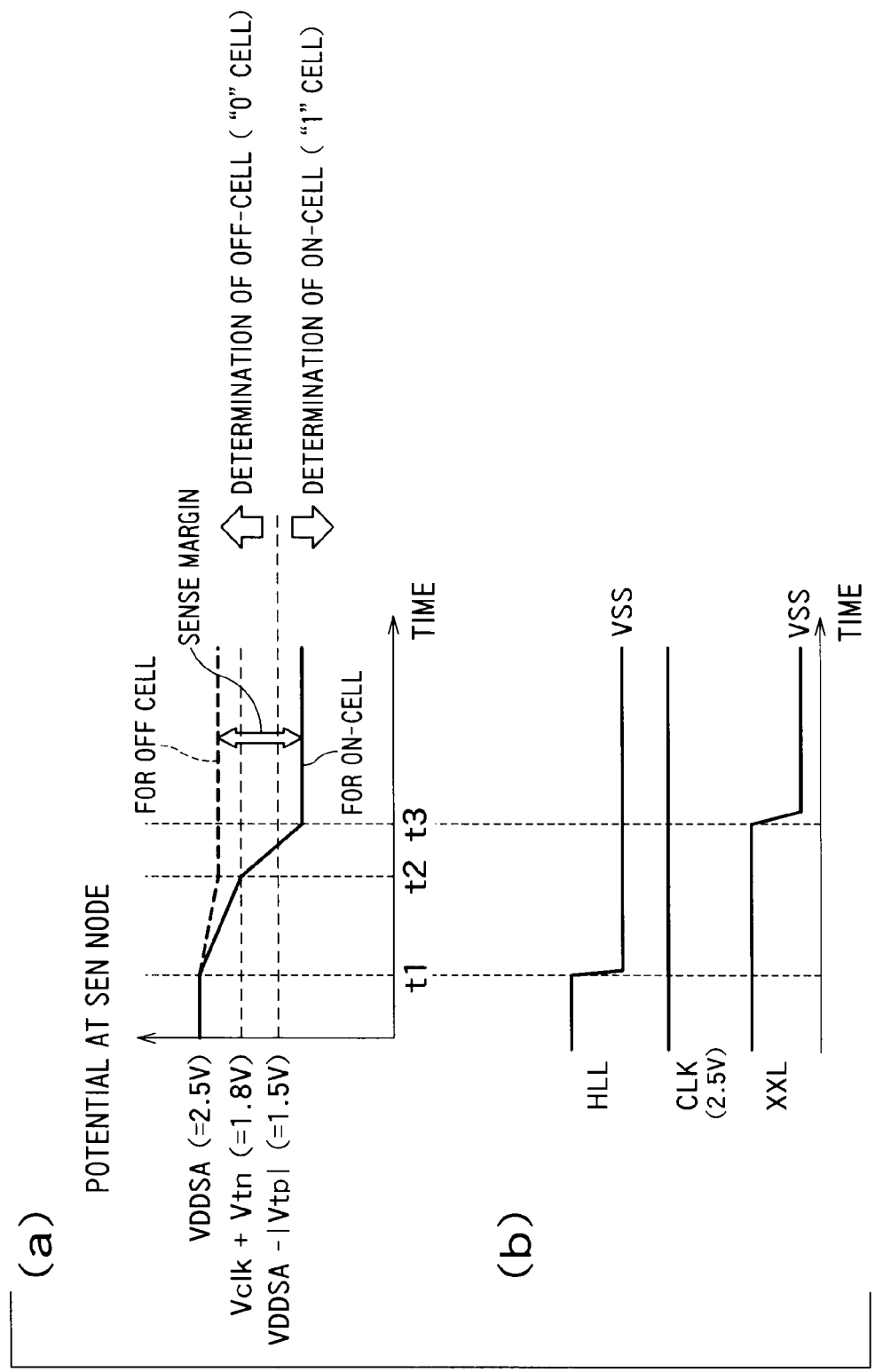
FIG. 3(a) is a timing chart of a potential at a SEN node when a potential at a CLK node is 2.5 V.
FIG. 3(b) is a timing chart of a NMOS transistor and the potential at the CLK node.

FIG. 3(a) illustrates the state of the discharge at the SEN node when 2.5 [V] is applied to the CLK node (i.e., Vclk=2.5 V). The potential at the SEN node is expressed by a solid line when the selected memory cell is the on-cell, and the potential at the SEN node is expressed by a broken line when the selected memory cell is the off-cell. FIG. 3(b) is a timing chart of a potential at the gate terminal HLL of the NMOS transistor 14, the potential at the CLK node, and the potential at the gate terminal XXL of the NMOS transistor 15. The operation of the semiconductor storage device of the embodiment will be described with reference to FIGS. 3(a) and 3(b).

(1) The SEN node is charged until a time t1 by the above-described method. Therefore, as can be seen from FIG. 3(a), the potential Vsen at the SEN node becomes the power-supply voltage VDDSA of the sense amplifier. Then, the read target memory cell (selected memory cell) is selected as described above.

(2) At the time t1, the gate terminal HLL of the NMOS transistor 14 is changed from "High" to "Low", and the SEN node is electrically separated from the power supply of the sense amplifier. Therefore, as can be seen from FIG. 3(a), when the selected memory cell is the on-cell, the relatively large cell current is passed to discharge the SEN node, thereby decreasing the potential Vsen. On the other hand, when the selected memory cell is the off-cell, the relatively small cell current is passed by the leak current to gently decrease the potential Vsen.

(3) At a time t2, when the selected memory cell is the on-cell, the potential Vsen at the SEN node is decreased to the capacitance sudden change potential (Vclk+Vtn=1.8 [V]) to rapidly decrease the capacitance of the NMOS capacitor 19. Therefore, a discharge rate of the SEN node is enhanced from the time t2. On the other hand, when the selected memory cell is the off-cell, the discharge rate is not changed because the potential Vsen at the SEN node is not decreased to the capacitance sudden change potential.

(4) At a time t3, the gate terminal XXL of the NMOS transistor 15 is changed from "High" to "Low". Therefore, the SEN node is electrically separated from the bit line BL to become the floating state, and the discharge of the SEN node is stopped. Then, as described above, the determination whether the selected memory cell is the on-cell or the off-cell is made based on the potential at the SEN node after the discharge is stopped.

As described above, in the embodiment, only when the selected memory cell is the on-cell, the discharge of the SEN node is accelerated by utilizing the change in capacitance of the NMOS capacitor 19. Therefore, the case where the selected memory cell is the on-cell can largely differ from the case where the selected memory cell is the off-cell in the potential at the SEN node after the discharge is stopped. As a result, according to the embodiment, the large sense margin is obtained even in the small on/off ratio, so that the read error can be reduced.

However, the effect is not always obtained, but it is necessary the potential Vclk at the CLK node satisfy a predetermined condition. This will be described in detail below.

Figure 4:
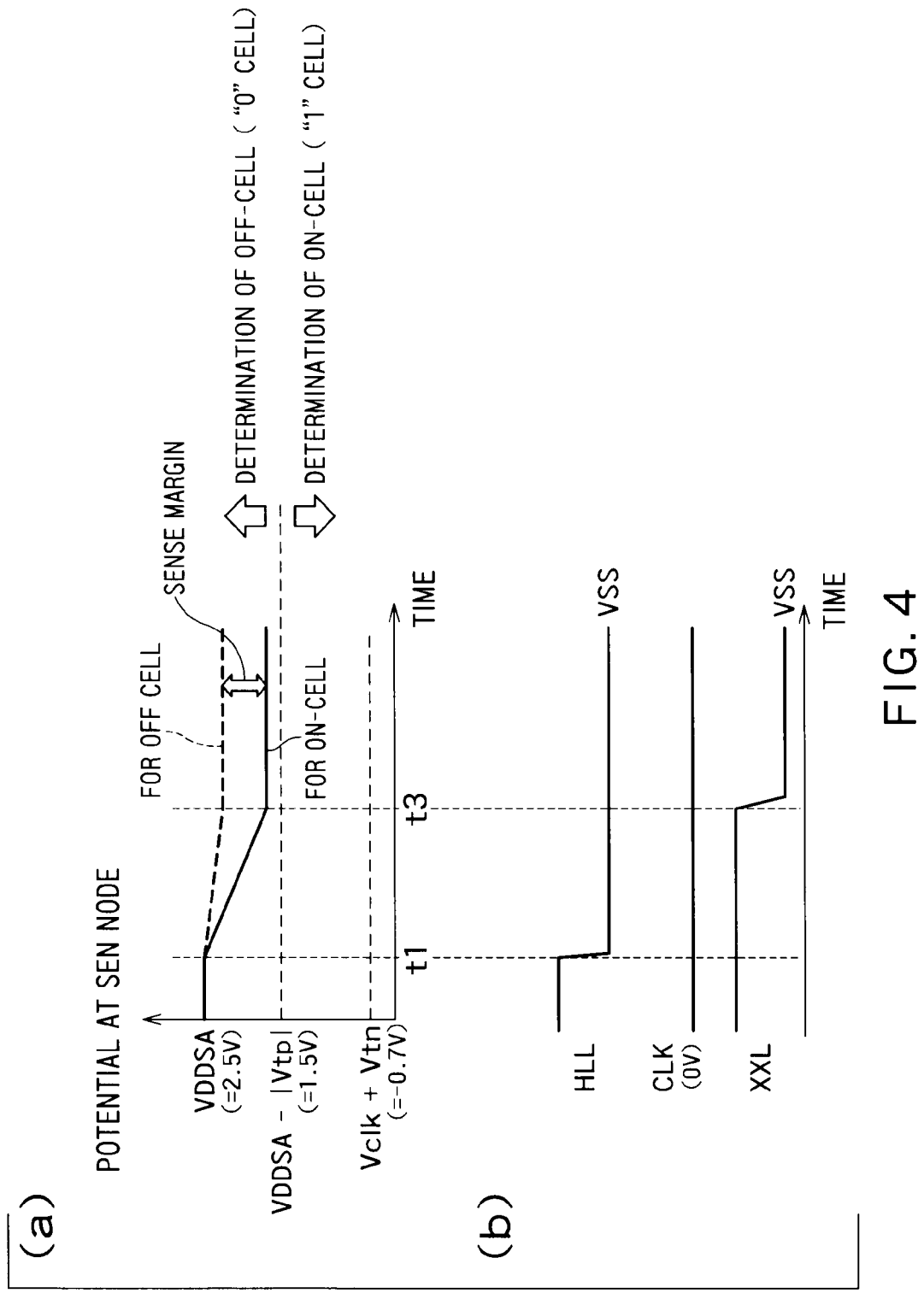
FIG. 4(a) is a timing chart of the potential at the SEN node when the potential at the CLK node is 0 V.
FIG. 4(b) is a timing chart of the NMOS transistor and the potential at the CLK node.

FIG. 4(a) illustrates the state of the discharge at the SEN node when 0 [V] is applied to a CLK node (Vclk=0 V). FIG. 4(b) illustrates a timing chart of the potential at the gate terminal HLL of the NMOS transistor 14, the potential at the CLK node, and the potential at the gate terminal XXL of the NMOS transistor 15. For Vclk=0 V, the capacitance sudden change potential becomes −0.7 V. The value of −0.7 V is lower than the potential (for example, 0.7 V) at the SEN node that is clamped by the NMOS transistor 12(BLX) and the NMOS transistor 15(XXL). Therefore, as can be seen from FIGS. 4(a) and 4(b), because the discharge of the SEN node is not accelerated, the effect of the sense margin increase is not obtained.

In addition, when the on-cell has the small cell current due to the finer design rule of the memory cell, as illustrated in FIG. 4(a), occasionally the potential at the SEN node becomes larger than the determination threshold VDDSA−|Vtp| (=1.5 [V]) after the discharge is stopped. In this case, even if the selected memory cell is the on-cell, the read error is generated such that the selected memory cell is the off-cell.

A range of the CLK node potential at which the effect of the sense margin increase is obtained will be described below.

In order to obtain the effect of the sense margin increase, it is necessary that the capacitance of the NMOS capacitor 19 be decreased during the discharge of the SEN node only when the selected memory cell is the on-cell. In other words, the capacitance sudden change potential (Vclk+Vtn) may be smaller than the potential Vsen_off at the SEN node after the discharge is stopped when the selected memory cell is the off-cell, and may be larger than the determination threshold VDDSA−|Vtp|, which is used to make the determination whether the selected memory cell is the on-cell or the off-cell.

Figure 5:
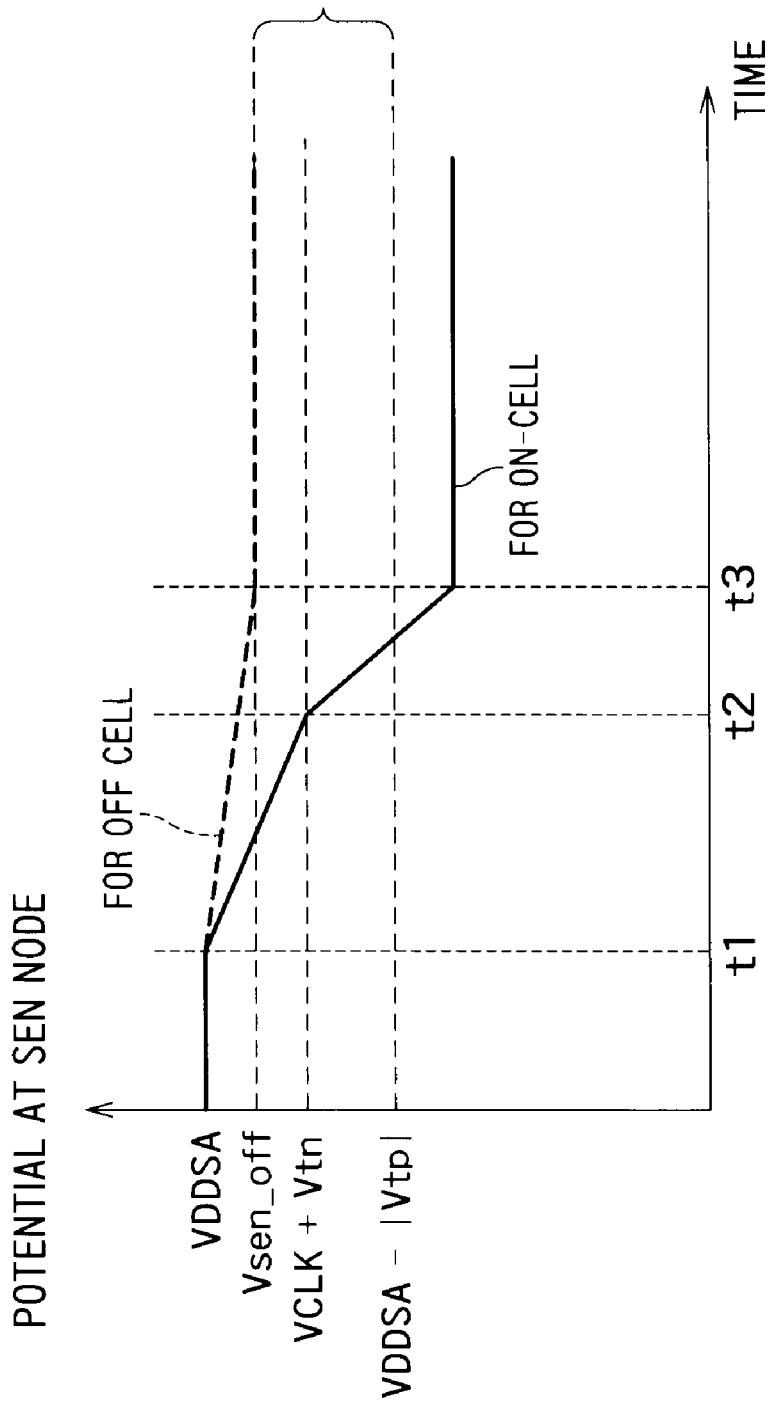
FIG. 5 is a timing chart of the potential at the SEN node when the potential at the CLK node satisfies a predetermined condition.

FIG. 5 illustrates a timing chart of the potential at the SEN node when the potential Vclk at the CLK node satisfies the aforementioned condition. As can be seen from FIG. 5, the discharge rate of the SEN node is accelerated during the discharge only when the selected memory cell is the on-cell.

Figure 6:
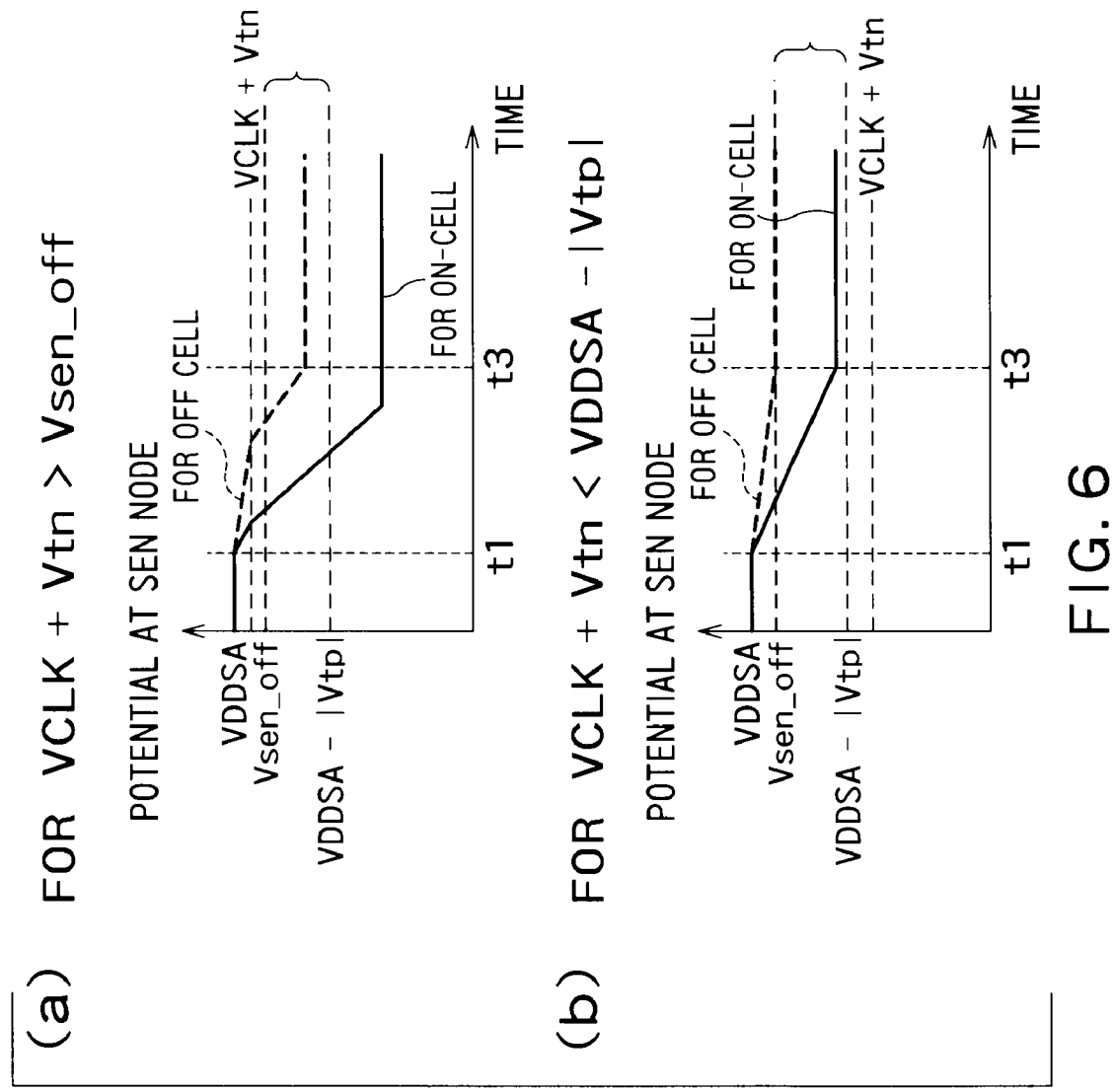
FIGS. 6(a) and 6(b) are timing charts of the potential at the SEN node when the potential at the CLK node does not satisfy the predetermined condition.

On the other hand, FIGS. 6(a) and 6(b) illustrate timing charts of the potential Vsen at the SEN node when the potential Vclk at the CLK node does not satisfy the aforementioned condition.

FIG. 6(a) illustrates the state of the discharge at the SEN node when the potential at the CLK node is set such that the capacitance sudden change potential (Vclk+Vtn) is larger than the potential Vsen_off. In this case, not only when the selected memory cell is the on-cell, but also when the selected memory cell is the off-cell, the capacitance of the NMOS capacitor 19 is decreased to enhance the discharge rate of the SEN node during the discharge of the SEN node. Therefore, as can be seen from FIG. 6(a), the sense margin of the off-cell is decreased, which results in the possibility of mistakenly reading the off-cell as the on-cell. Incidentally, as illustrated in FIG. 6(a), when the selected memory cell is the on-cell, the potential at the SEN node is settled to a constant level before the SEN node is electrically separated from the bit line BL. This is because the potential at the SEN node is clamped at a value determined by the NMOS transistor 12 and the like.

On the other hand, FIG. 6(b) illustrates the state of the discharge at the SEN node when the potential at the CLK node is set such that the capacitance sudden change potential (Vclk+Vtn) is smaller than the determination threshold VDDSA−|Vtp|. As can be seen from FIG. 6(b), in the case, the discharge rate of the SEN node is not accelerated, when the selected memory cell is the on-cell, and when the selected memory cell is the off-cell. Therefore, the effect of the sense margin increase is not obtained.

As can be seen from the above description, it is necessary that the capacitance sudden change potential (Vclk+Vtn) satisfy the following expression (1):

$$VDDSA-|Vtp|<Vclk+Vtn<Vsen\_off \quad (1)$$

Here, assuming that C is a combined capacitance of a capacitance (Ca) in the inverted region of the NMOS capacitor 19 and a parasitic capacitance of the SEN node, Icell_off_max is a maximum value of the cell current when the selected memory cell is the off-cell, and Tsen is a discharge time of the SEN node, the potential Vsen_off at the SEN node is expressed by the following expression (2) after the discharge is stopped when the selected memory cell is the off-cell:

$$Vsen\_off=VDDSA-(Icell\_off\_max\cdot Tsen)/C \quad (2)$$

Incidentally, as can be seen from the expression (2), the potential Vsen_off is changed by the capacitance of the NMOS capacitor 19. For example, the potential Vsen_off is decreased when the capacitance of the NMOS capacitor 19 is decreased.

An expression (3) is obtained when the expression (2) is substituted in the expression (1):

$$VDDSA-|Vtp|<Vclk+Vtn<VDDSA-(Icell\_off\_max\cdot Tsen)/C \quad (3)$$

An expression (4) is obtained by transforming the expression (3):

$$VDDSA-|Vtp|-Vtn<Vclk<VDDSA-(Icell\_off\_max\cdot Tsen)/C-Vtn \quad (4)$$

In order to obtain the effect of the sense margin increase, it is necessary that the potential Vclk at the CLK node satisfy the inequality expression (4). Assuming that VDDSA is set to 2.5 V, Vtp is set to −1 [V], Vtn is set to −0.7 [V], Icell_off_max is set to 15 [nA], Tsen is set to 1200 [ns], and C is set to 19 [fC], the potential Vclk satisfying the expression (4) becomes a value that is larger than 2.2 [V] and smaller than 2.25 [V].

The expression (3) includes parameters such as Icell_off_max and Tsen whose values are fixed by measuring a produced chip after the production of the flash memory is completed. Therefore, the potential Vclk satisfying the expression (3) cannot previously be fixed before the production. That is, the potential Vclk at the CLK node, which satisfies the expression (3), is obtained after the production of the flash memory is completed. Therefore, a driver that can output a voltage of a certain degree of range (including a value Vclk satisfying the expression (3)) according to the setting is preferably provided as the constant voltage source 21.

Next, two configuration examples of the driver will be described below with reference to FIGS. 7 and 8.

Figure 7:
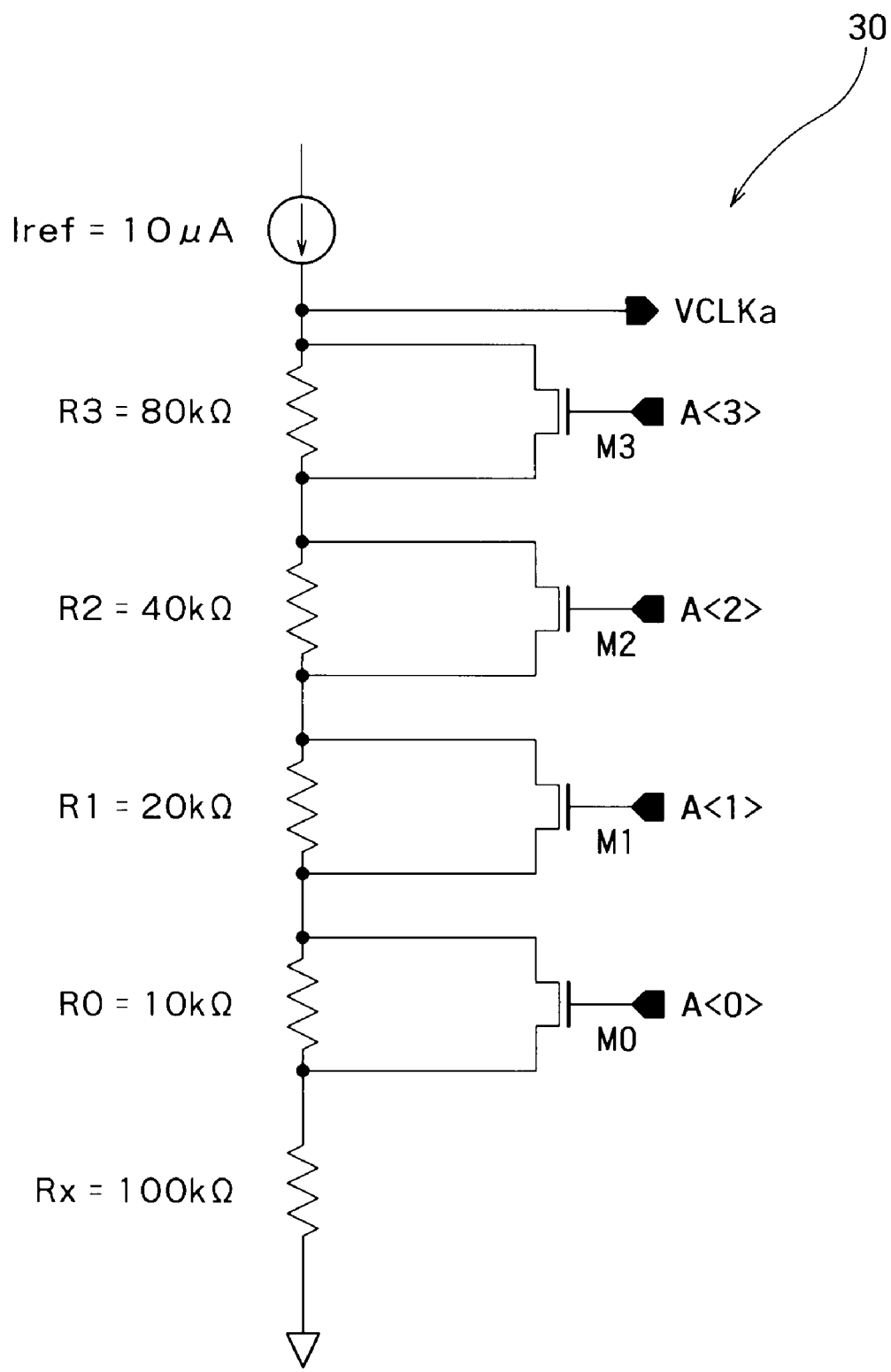
FIG. 7 is a view illustrating a configuration example of a driver that outputs a desired voltage to the CLK node.
Figure 8:
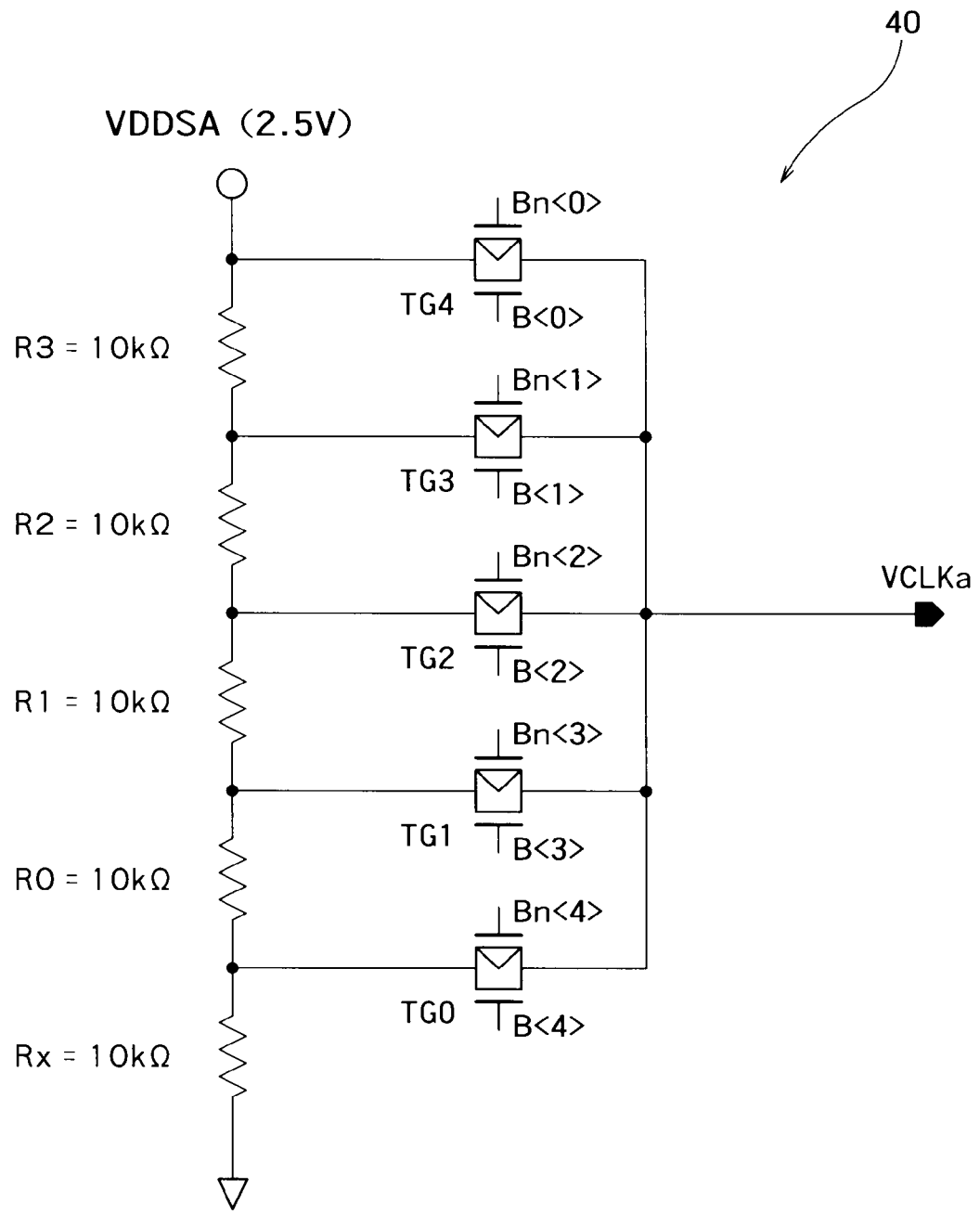
FIG. 8 is a view illustrating a configuration example of another driver that outputs the desired voltage to the CLK node.

FIG. 7 illustrates a circuit diagram of a driver 30 that outputs a voltage to the CLK node. As can be seen from FIG. 7, a constant current source (Iref=10 μA) is connected to one end of a series-connected resistors (Rx and R0 to R3), and the other end is grounded. The resistors Rx has a resistance value of 100 kΩ, and the resistors R0, R1, R2, and R3 have resistance values of 10 kΩ, 20 kΩ, 40 kΩ, and 80 kΩ, respectively. In addition, as can be seen from FIG. 7, NMOS transistors M0 to M3 are connected in parallel to the resistors R0 to R3, respectively. Signals A<0> to A<3> are input to gate terminals of the NMOS transistors M0 to M3, respectively. An output terminal VCLKa of the driver 30 outputs a potential at a node between the constant current source Iref and the resistor R3.

In the driver 30, the voltage output from the VCLKa terminal can be changed according to a value of signal A<3:0>. Table 1 illustrates a relationship between the signal A<3:0> and the voltage output from the terminal VCLKa. As illustrated in Table 1, the output of the driver 30 can be set from 1.0 [V] to 2.5 [V] by 0.1-[V] increments. Incidentally, when the range of the potential Vclk at the CLK node, which satisfies the expression (3), is largely changed by the design rule or the characteristic of the memory cell, the resistance values of the resistors Rx and R0 to R3 and the current value Iref of the constant current source are changes to adapt the output of the driver 30 to the expression (3).

[Table 1]

Next, another configuration example of the driver will be described below. FIG. 8 illustrates a circuit diagram of a driver 40 that outputs the voltage to the CLK node. As can be seen from FIG. 8, one end of the series-connected resistors (Rx and R0 to R3) is connected to the power supply (VDDSA) of the sense amplifier, and the other end is grounded. Each of the resistors Rx and R0 to R3 has a resistance value of 10 kΩ. As can be seen from FIG. 8, input ends of transfer gates TG0 to TG4 are connected between the resistors Rx and R0, between the resistors R0 and R1, between the resistors R1 and R2, between the resistors R2 and R3, and between the power supply and resistor R3, respectively. Output ends of the transfer gates TG0 to TG4 are connected to the output terminal VCLKa of the driver 40. In FIG. 8, signals B<4:0> and Bn<4:0> are complementary signals.

In the driver 40, the voltage output from the VCLKa terminal can be changed according to a value of the signal B<4:0> of the transfer gate. Table 2 illustrates a relationship between the signal B<4:0> and the voltage output from the terminal VCLKa. As illustrated in Table 2, the output of the driver 40 can be set from 0.5 [V] to 2.5 [V] by 0.5-[V] increments.

[Table 2]

As described above, the C-V characteristic of the NMOS capacitor, in which one end is connected to the SEN node while the other end is connected to the CLK node, is utilized in the embodiment. The discharge rate of the SEN node is enhanced only when the selected memory cell is the on-cell, by applying the voltage within the predetermined range to the CLK node. Therefore, the case where the selected memory cell is the on-cell can largely differ from the case where the selected memory cell is the off-cell in the potential at the SEN node after the discharge is stopped. As a result, even in the small on/off ratio, the large sense margin can be obtained to reduce the read error.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

TABLE 1

| A<3> | A<2> | A<1> | A<0> | VCLKa [V] |
|---|---|---|---|---|
| 0 | 0 | 0 | 0 | 2.5 |
| 0 | 0 | 0 | 1 | 2.4 |
| 0 | 0 | 1 | 0 | 2.3 |
| 0 | 0 | 1 | 1 | 2.2 |
| . | | | | |
| . | | | | |
| 1 | 1 | 1 | 0 | 1.1 |
| 1 | 1 | 1 | 1 | 1.0 |

TABLE 2

| B<0> | B<1> | B<2> | B<3> | B<4> | VCLKa |
|---|---|---|---|---|---|
| 1 | 0 | 0 | 0 | 0 | 2.5 V |
| 0 | 1 | 0 | 0 | 0 | 2.0 V |
| 0 | 0 | 1 | 0 | 0 | 1.5 V |
| 0 | 0 | 0 | 1 | 0 | 1.0 V |
| 0 | 0 | 0 | 0 | 1 | 0.5 V |

The invention claimed is:

1. A semiconductor storage device comprising:
    a NAND string that includes a plurality of series-connected memory cells, one end of the NAND string being connected to a bit line while the other end is connected to a common source line;
    a SEN node that is configured to be able to be electrically connected to a voltage source and the bit line; and
    a capacitor in which one end is connected to the SEN node while the other end is connected to a CLK node, to which a voltage within a predetermined range is applied, a discharge rate of the SEN node being enhanced by decreasing a capacitance during discharge of the SEN node only when a selected memory cell selected from the plurality of memory cells is an on-cell.

2. The semiconductor storage device according to claim 1, wherein the capacitor is a NMOS transistor, a gate of the NMOS transistor being connected to the SEN node, a source and a substrate of the NMOS transistor being connected to the CLK node.

3. The semiconductor storage device according to claim 2, further comprising a first PMOS transistor whose gate is connected to the SEN node, the first PMOS transistor being turned on when a potential at the SEN node is lower than a determination threshold fixed by a voltage at the voltage source and a threshold voltage of the first PMOS transistor, thereby electrically connecting the voltage source and an INV node that is an input terminal of a storage circuit, a read result of the selected memory cell being stored in the storage circuit.

4. The semiconductor storage device according to claim 3, wherein a potential at the CLK node satisfies the following expression:

$$VDDSA-|Vtp|-Vtn<Vclk<VDDSA-(Icell\_off\_max \cdot Tsen)/C-Vtn$$

where Vclk is the potential at the CLK node, VDDSA is a voltage at the voltage source, |Vtp| is an absolute value of a threshold voltage of the first PMOS transistor, Vtn is a threshold voltage of the NMOS transistor, Icell_off_max is a maximum value of the cell current when the selected memory cell is an off-cell, C is a combined capacitance of the capacitor and a parasitic capacitance of the SEN node, and Tsen is a discharge time of the SEN node.

5. The semiconductor storage device according to claim 4, further comprising a second PMOS transistor whose gate is connected to the INV node, the second PMOS transistor being turned on by discharging the INV node to electrically connect the voltage source and the SEN node.

6. The semiconductor storage device according to claim 3, further comprising a second PMOS transistor whose gate is connected to the INV node, the second PMOS transistor being turned on by discharging the INV node to electrically connect the voltage source and the SEN node.

7. The semiconductor storage device according to claim 3, further comprising a driver whose output terminal is connected to the CLK node, the driver being able to output the voltage within the predetermined range.

8. The semiconductor storage device according to claim 7, wherein the driver includes:
   a plurality of series-connected resistors in which one end is connected to a constant current source while the other end is grounded; and
   a plurality of MOS transistors each of which is connected in parallel to each of the plurality of resistors, a signal being input to a gate terminal of each of the plurality of MOS transistors according to a voltage that should be applied to the CLK node, and
   the output terminal of the driver is connected between the constant current source and one end of the plurality of resistors.

9. The semiconductor storage device according to claim 7, wherein the driver includes:
   a plurality of series-connected resistors in which one end is connected to a constant voltage source while the other end is grounded; and
   a plurality of transfer gates in which one end of each of the plurality of transfer gates is connected to one end of each of the plurality of resistors, the other end of the plurality of transfer gates being connected to the output terminal, a signal being input to a gate terminal of each of the plurality of transfer gates according to a voltage that should be applied to the CLK node.

10. A method for reading from the semiconductor storage device according to claim 3, comprising:
   charging the SEN node by electrically connecting the SEN node to the voltage source;
   separating electrically the SEN node from the voltage source while electrically connecting the SEN node to the bit line after selecting the selected memory cell from the plurality of memory cells, thereby discharging the SEN node;
   separating electrically the bit line and the SEN node from each other after a predetermined time elapses since the discharge of the SEN node is started, thereby stopping the discharge of the SEN node; and
   determining a state of the selected memory cell based on the potential at the SEN node after the discharge is stopped.

11. The semiconductor storage device according to claim 2, further comprising a driver whose output terminal is connected to the CLK node, the driver being able to output the voltage within the predetermined range.

12. The semiconductor storage device according to claim 11, wherein the driver includes:
   a plurality of series-connected resistors in which one end is connected to a constant current source while the other end is grounded; and
   a plurality of MOS transistors each of which is connected in parallel to each of the plurality of resistors, a signal being input to a gate terminal of each of the plurality of MOS transistors according to a voltage that should be applied to the CLK node, and
   the output terminal of the driver is connected between the constant current source and one end of the plurality of resistors.

13. The semiconductor storage device according to claim 11, wherein the driver includes:
   a plurality of series-connected resistors in which one end is connected to a constant voltage source while the other end is grounded; and
   a plurality of transfer gates in which one end of each of the plurality of transfer gates is connected to one end of each of the plurality of resistors, the other end of the plurality of transfer gates being connected to the output terminal, a signal being input to a gate terminal of each of the plurality of transfer gates according to a voltage that should be applied to the CLK node.

14. A method for reading from the semiconductor storage device according to claim 2, comprising:
   charging the SEN node by electrically connecting the SEN node to the voltage source;
   separating electrically the SEN node from the voltage source while electrically connecting the SEN node to the bit line after selecting the selected memory cell from the plurality of memory cells, thereby discharging the SEN node;
   separating electrically the bit line and the SEN node from each other after a predetermined time elapses since the discharge of the SEN node is started, thereby stopping the discharge of the SEN node; and
   determining a state of the selected memory cell based on the potential at the SEN node after the discharge is stopped.

15. The semiconductor storage device according to claim 1, further comprising a first PMOS transistor whose gate is connected to the SEN node, the first PMOS transistor being turned on when a potential at the SEN node is lower than a determination threshold fixed by a voltage at the voltage source and a threshold voltage of the first PMOS transistor, thereby electrically connecting the voltage source and an INV node that is an input terminal of a storage circuit, read result of the selected memory cell being stored in the storage circuit.

16. The semiconductor storage device according to claim 15, wherein a potential at the CLK node satisfies the following expression:

$$VDDSA-|Vtp|-Vtn<Vclk<VDDSA-(Icell\_off\_max \cdot Tsen)/C-Vtn$$

where Vclk is the potential at the CLK node, VDDSA is a voltage at the voltage source, |Vtp| is an absolute value of a threshold voltage of the first PMOS transistor, Vtn is a threshold voltage of the NMOS transistor, Icell_off_max is a maximum value of the cell current when the selected memory cell is an off-cell, C is a combined capacitance of the capacitor and a parasitic capacitance of the SEN node, and Tsen is a discharge time of the SEN node.

17. The semiconductor storage device according to claim 16, further comprising a second PMOS transistor whose gate is connected to the INV node, the second PMOS transistor being turned on by discharging the INV node to electrically connect the voltage source and the SEN node.

18. The semiconductor storage device according to claim 15, further comprising a second PMOS transistor whose gate is connected to the INV node, the second PMOS transistor being turned on by discharging the INV node to electrically connect the voltage source and the SEN node.

19. The semiconductor storage device according to claim 1, further comprising a driver whose output terminal is connected to the CLK node, the driver being able to output the voltage within the predetermined range.

20. A method for reading from the semiconductor storage device according to claim 1, comprising:
   charging the SEN node by electrically connecting the SEN node to the voltage source;
   separating electrically the SEN node from the voltage source while electrically connecting the SEN node to the bit line after selecting the selected memory cell from the plurality of memory cells, thereby discharging the SEN node;
   separating electrically the bit line and the SEN node from each other after a predetermined time elapses since the discharge of the SEN node is started, thereby stopping the discharge of the SEN node; and
   determining a state of the selected memory cell based on the potential at the SEN node after the discharge is stopped.

* * * * *